(12) United States Patent
Yamamoto et al.

(10) Patent No.: US 7,893,467 B2
(45) Date of Patent: Feb. 22, 2011

(54) SILICON CARBIDE SEMICONDUCTOR DEVICE HAVING JUNCTION BARRIER SCHOTTKY DIODE

(75) Inventors: Takeo Yamamoto, Nishikamo-gun (JP); Eiichi Okuno, Mizuho (JP)

(73) Assignee: DENSO CORPORATION, Kariya (JP)

(*) Notice: Subject to any disclaimer, the term of this patent is extended or adjusted under 35 U.S.C. 154(b) by 360 days.

(21) Appl. No.: 12/153,825

(22) Filed: May 27, 2008

(65) Prior Publication Data

US 2008/0296587 A1 Dec. 4, 2008

(30) Foreign Application Priority Data

May 30, 2007 (JP) .............................. 2007-143328

(51) Int. Cl.
*H01L 29/66* (2006.01)

(52) U.S. Cl. ................ 257/280; 257/77; 257/260; 257/284; 257/472; 257/484; 257/492; 257/E21.163; 257/E21.359

(58) Field of Classification Search .............. 257/77, 257/471–473, 475, 481, 483–485, 487–488, 257/493, 654, E21.163, E21.359, 928, 260, 257/267, 280, 281, 284, 492, 494
See application file for complete search history.

(56) References Cited

U.S. PATENT DOCUMENTS 6,870,201 B1 * 3/2005 Deboy et al. ................ 257/170

2005/0045982 A1 * 3/2005 Shenai ........................ 257/481
2006/0006394 A1 * 1/2006 Kordina ....................... 257/77
2006/0118900 A1 * 6/2006 Zeghbroeck ................ 257/483
2006/0208332 A1 * 9/2006 Duskin et al. ............... 257/484
2006/0226504 A1 * 10/2006 Hatakeyama et al. ....... 257/472
2006/0255423 A1 * 11/2006 Ryu et al. .................... 257/485

FOREIGN PATENT DOCUMENTS

| JP | A-02-137368 | 5/1990 |
| JP | H02-137368 | * 5/1990 |
| JP | A-2000-252478 | 9/2000 |
| JP | A-2000-294804 | 10/2000 |
| JP | A-2003-158259 | 5/2003 |
| JP | 2006196652 A | * 7/2006 |

OTHER PUBLICATIONS

Office Action dated Jun. 2, 2009 from the Japan Patent Office in the corresponding JP Application No. 2007-143328 (and English Translation).

* cited by examiner

*Primary Examiner*—Fernando L Toledo
(74) *Attorney, Agent, or Firm*—Posz Law Group, PLC

(57) ABSTRACT

A silicon carbide semiconductor device includes a substrate; a drift layer having a first conductivity type; an insulating layer; a Schottky electrode; an ohmic electrode; a resurf layer; and second conductivity type layers. The drift layer and the second conductivity type layers provide multiple PN diodes. Each second conductivity type layer has a radial width with respect to a center of a contact region between the Schottky electrode and the drift layer. A radial width of one of the second conductivity type layers is smaller than that of another one of the second conductivity type layers, which is disposed closer to the center of the contact region than the one of the second conductivity type layers.

11 Claims, 10 Drawing Sheets

SILICON CARBIDE SEMICONDUCTOR DEVICE HAVING JUNCTION BARRIER SCHOTTKY DIODE

CROSS REFERENCE TO RELATED APPLICATION

The present application is based on Japanese Patent Application No. 2007-143328 filed on May 30, 2007, the disclosure of which is incorporated herein by reference.

FIELD OF THE INVENTION

The present invention relates to a silicon carbide semiconductor device having a junction barrier Schottky diode (JBS).

BACKGROUND OF THE INVENTION

In a Schottky barrier diode (SBD), at an interface between a Schottky electrode made of metal and a semiconductor region, a work function difference between the metal and semiconductor is typically small. Because of the material property difference, a leakage current of the SBD may be relatively larger than that of a PN diode when the diodes are reverse-biased.

Japanese Unexamined Patent Application Publication Number 2000-294804 shows a semiconductor device having a JBS, in which a PN diode is disposed on a part of a Schottky junction to suppress a leakage current when reverse-biased. The semiconductor device having a JBS is described below with reference to FIG. 8. The semiconductor device includes a Schottky electrode J1, an N− type drift layer J2, a resurf layer J3, and P type layers J4. The P type layers J4 have a projected shape and stripe structure. The P type layers J4 are disposed in a surface layer of and an internal portion of the N− type drift layer 2. The p type layers J4 are disposed in an area located inside of the resurf layer J3 and an area located inside of a contact region between the Schottky electrode J1 and the N− type drift layer J2. The resurf layer J3 is included in a termination structure. The termination structure may function as a periphery part for voltage proof.

According to the JBS shown in Japanese Unexamined Patent Application Publication Number 2000-294804, since a depth of each p type layers J4 is substantially equal to that of the resurf layer J3, a depletion layer may be created near the p type layers J4 in a case of surge. A dot line in FIG. 8 shows a location of the depletion layer. In the above case, an electric field due to the surge is easier to concentrate at an area located around a boundary between the p type layers J4 and the resurf layer J3. Such electric concentration may cause failure of the semiconductor device. Symbols VIII shown in FIG. 8 indicate the location of the electric field concentration.

SUMMARY OF THE INVENTION

In view of the above-described problem, it is an object of the present invention to provide a silicon carbide (SiC) semiconductor device having a JBS, the SiC semiconductor device being capable of restricting failure in a case of a surge.

According to an aspect of the present invention, a silicon carbide semiconductor device includes: a substrate made of silicon carbide, having a first conductivity type, and having a principal surface and a rear surface opposite to each other; a drift layer made of silicon carbide, having a first conductivity type, and disposed on the principal surface of the substrate, wherein an impurity concentration of the drift layer is lower than that of the substrate; an insulating layer disposed on the drift layer and including an opening, wherein a part of the substrate and a part of the drift layer are defined as a cell, which is positioned between the opening of the insulating layer and the rear surface of the substrate; a Schottky electrode contacting the drift layer through the opening of the insulating layer to provide a Schottky contact; an ohmic electrode disposed on the rear surface of the substrate; a Schottky barrier diode provided by the ohmic electrode and the Schottky electrode; a resurf layer disposed in a surface portion of the drift layer, having a second conductivity type, and surrounding the cell, wherein the resurf layer provides a termination structure; a plurality of second conductivity type layers disposed in another surface portion of the drift layer, contacting the Schottky electrode, surrounded by the resurf layer, and separated from one another. The drift layer and the plurality of second conductivity type layers provide a plurality of PN diodes. Each second conductivity type layer has a radial width with respect to a center of a contact region between the Schottky electrode and the drift layer. The radial width of one of the plurality of second conductivity type layers is smaller than that of another one of the plurality of second conductivity type layers, the another one being disposed closer to the center of the contact region than the one of the plurality of second conductivity type layers.

According to the above silicon carbide semiconductor device, since the radial width of the another one of the plurality of second conductivity type layers is larger than that of the one of the plurality of second conductivity type layers, an electric field is harder to concentrate at a boundary area between the Schottky electrode and the drift layer. It is possible to provide the silicon carbide semiconductor device with a higher break down voltage.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
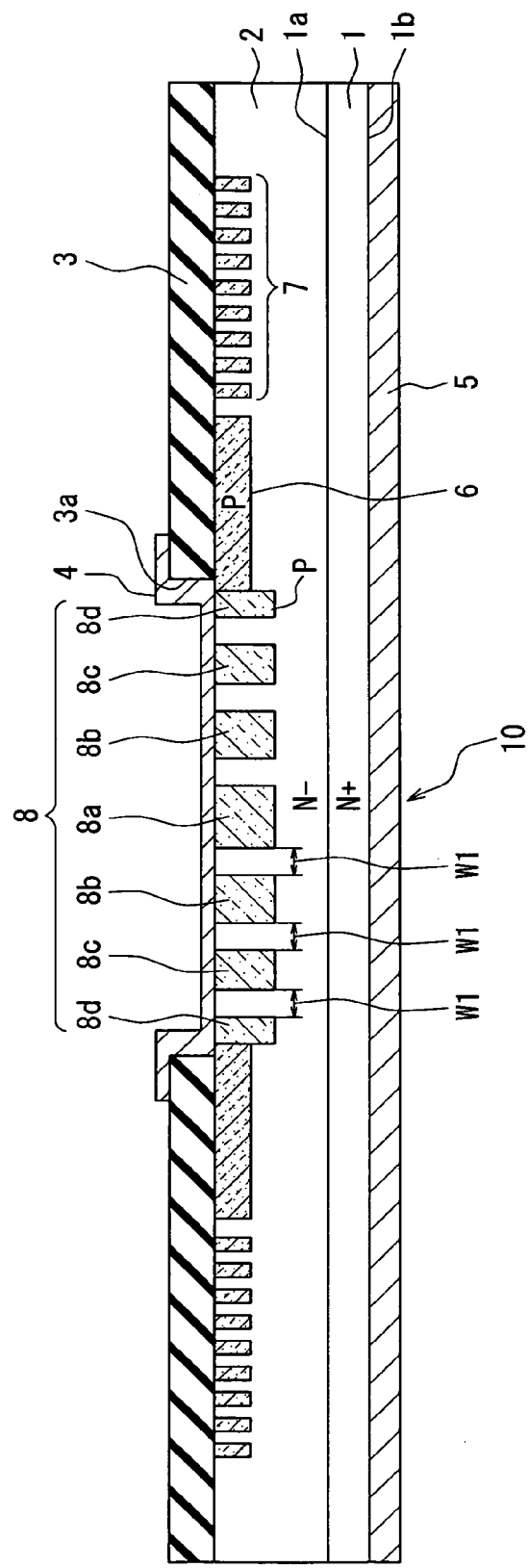
FIG. 1 is a diagram illustrating a cross sectional view of an SiC semiconductor device taken along line I-I shown in FIG. 2 and line I-I in FIG. 7.

An SiC semiconductor device having a JBS according to a first embodiment is described below with reference to FIGS. 1 and 2.

The SiC semiconductor device includes an N+ type substrate 1 made of SiC, the N− type drift layer 2 made of SiC. An impurity concentration of the N+ type substrate 1 is in a range, for example, between $2\times10^{18}$ cm$^{-3}$ and $1\times10^{21}$ cm$^{-3}$. The N+ type substrate 1 includes a top surface 1a and a bottom surface 1b opposite to each other. The top surface 1a and the bottom surface 1b are also referred to hereinafter as a principal surface 1a and a rear surface 1b, respectively. The N− type drift layer 2 made of SiC is disposed on the principal surface 1a. The N− type drift layer 2 may be a stacked layer. A dopant concentration of the N− type drift layer 2 is, for example, in a range between $2.5\times10^{15}$ cm$^{-3}$ and $7.5\times10^{15}$ cm$^{-3}$ and lower than that of the N+ type substrate 1. A portion of the N+ type substrate 1 and a portion of the N− type drift layer 2 provide a cell where an SBD 10 is disposed. The SiC semiconductor device includes a termination structure disposed in an area surrounding the cell.

The SiC semiconductor device further includes an insulating layer 3, a Schottky electrode 4, and an ohmic electrode 5. The insulating layer 3 has an opening 3a and is disposed on a surface of the N− type drift layer 2. The insulating layer 3 may be a silicon oxide layer. A location of the opening 3a corresponds to the cell. As shown in FIG. 1, a part of the Schottky electrode 4 is disposed in the opening 3a and in contact with the N− type drift layer 2. The Schottky electrode 4 is made of, for example, molybdenum (Mo), titanium (Ti), nickel (Ni), or the like. The opening 3a of the insulating layer 3 has a circular shape, as shown in FIG. 2. The Schottky electrode 4 is in contact with the N− type drift layer 2 through the opening 3a. The ohmic electrode 5 is disposed on and in contact with the N+ type substrate 1. The ohmic electrode 5 is made of Ti, Mo, tungsten (W), or the like. The above configuration provides the SBD 10.

The termination structure is disposed in a periphery of the SBD 10 so as to surround the Schottky electrode 4. The termination structure includes a P type resurf layer 6 and multiple P type guard ring layers 7. The P type resurf layer 6 is disposed in a surface portion of the N− type drift layer 2 so as to contact with the Schottky electrode 4. The multiple P type guard ring layers 7 are disposed in an area surrounding the P type resurf layer 6. The P type resurf layer 6 may be closest to the cell among the elements of the termination structure. The P type resurf layer 6 has impurity such as aluminum for instance. An impurity concentration of the P type resurf layer 6 is in a range between $5\times10^{16}$ cm$^{-3}$ and $1\times10^{18}$ cm$^{-3}$. The P type resurf layer 6 and each P type guard ring layer 7 have an almost circular ring shape and surrounds the cell, as shown in FIG. 2. The presence of the layers 6, 7 causes an electric field to extend to a wide area surrounding the SBD 10, and accordingly, an electric field concentration is relaxed. It is thus possible to improve a breakdown voltage.

Multiple P type layers 8 are disposed in an area surround by an inner periphery of the P type resurf layer 6. The P type layers 8 are in contact with the Schottky electrode 4. The above structure provides a JBS, which includes a PN diode provided by the P type layers 8 and the N− type drift layer. As shown in FIG. 2, an outer periphery of each P type has a circular shape. The shape of the outer periphery of each P type layer 8 is similar to that of the cell. Alternatively, the shape of the outer periphery of each P type layer 8 may be similar to that of the Schottky electrode 4. The P type layers 8 includes a center member 8a having a circular shape and multiple ring members 8b-8d having a circular ring shape. The center member 8a is disposed at a center of a contact region between the Schottky electrode 4 and the N− type drift layer 2. Each ring member 8b-8d is arranged substantially in a concentric manner with respect to the center member 8a. In the present embodiment, the number of the multiple ring members 8b-8d is three. As shown in FIG. 2, each ring member 8b-8d has a circular ring shape. A shape of an outer periphery of each ring member 8b-8d is substantially similar to that of the cell. Alternatively, a shape of an outer periphery of each ring member 8b-8d may be substantially similar to the outer periphery of the Schottky electrode 4. One of the ring member 8d, which is disposed outermost distant from the center member 8a, is defined as the outermost ring member 8d. The outermost ring member 8d is in contact with an inner periphery surface of the P type resurf layer 6 or is embedded in the P type resurf layer 6.

Here, a two dimensional plane passing through a center of the center member 8a and being perpendicular to the principal surface 1a of the substrate 1 is defined. The two dimensional plane is, for example, a plane indicated by line I-I in FIG. 2. A configuration of the P type layers 8 is described below with reference to the two dimensional plane. As shown FIG. 1, the P type layers 8 are configured such that an arrangement of cross sections of the P type layers 8a-8d taken along the two dimensional plane is symmetric with respect to a symmetry axis, which passes through the center of the center member 8a and which is perpendicular to the principal surface 1a of the substrate 1. Further, the P type layers 8a-8d are arranged at regular intervals W1, as shown in FIG. 1. The P type layers 8a-8d are configured such that a width of each P type layer 8a-8d is larger as the P type layer is located near the center of the contact region between the Schottky electrode 4 and the N− type drift layer 2. An impurity concentration of each P type layers 8 is in a range, for example, between $5\times10^{17}$ cm$^{-3}$ and $1\times10^{20}$ cm$^{-3}$. The regular interval W1 between adjacent P type layers 8 is in a range, for example, between 1.5 μm and 2.5 μm.

According to the above structure, when a surge current flows, the P type layers located near the central portion has a large cross section, which causes a resistance to decrease. A larger portion of the surge current may flow through a part of the P type layers 8 located near the central portion. An electric field is accordingly harder to concentrate at the area located around the boundary between the termination structure and the P type layers. Therefore, it is possible to provide a higher surge breakdown voltage.

In the above-described SiC semiconductor device having the JBD, a current flows between the Schottky electrode 4 and the ohmic electrode 5 when a voltage larger than a Schottky barrier is applied to the Schottky electrode 4 such that the Schottky electrode 4 and the ohmic electrode 5 provide an anode and a cathode, respectively.

When the SBD or the JBS 10 is OFF, a depletion layer extends from the multiple P type layers 8 to the N− type drift layer; thereby, a portion of the N− type drift layer 2 positioned between the P type layers 8 is substantially fully-depleted. It is possible to reduce a leakage current when reverse-biased.

According to the present embodiment, the width of one of the multiple P type layers is smaller than that of another one of the multiple P type layers, the another one being disposed adjacent to the one of the multiple P type layers 8 and disposed closer to the center of the contact region than the one of the multiple P type layers 8. It should be noted that the width is defined as a width of each P type layer 8 on the contact region between each P type layer and the N− type drift layer 2. A portion of the P type layers 8 disposed around the central region has a large cross section for a surge current flow, and therefore a resistance is decreased. Thus, a surge current may be easier to flow through the portion around the center member 8a than a portion around the outermost ring member 8d. An electric field is harder to concentrate at the area located around the boundary between the termination structure and the P type layers. It is possible to provide a higher surge breakdown voltage.

A method for manufacturing the SiC semiconductor device according to the present embodiment is described below with reference to FIGS. 3A to 3E. FIGS. 3A-3E are diagrams illustrating cross sectional views in connection with processes in a method for manufacturing an SiC semiconductor device shown in, for example, FIG. 1. It should be note that the P type guard ring layers 7 are not shown in FIGS. 3A to 3E for simplicity of the drawings.

Figure 3A:
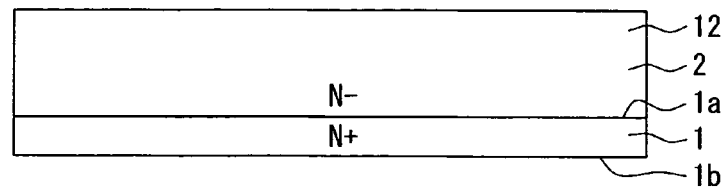
FIGS. 3A-3E are diagrams illustrating cross sectional views associated with processes in a method for manufacturing an SiC semiconductor device.

At a process shown in FIG. 3A, the N− type drift layer 2 is epitaxially grown on the principal surface 1a of the N+ type substrate 1.

Figure 3B:
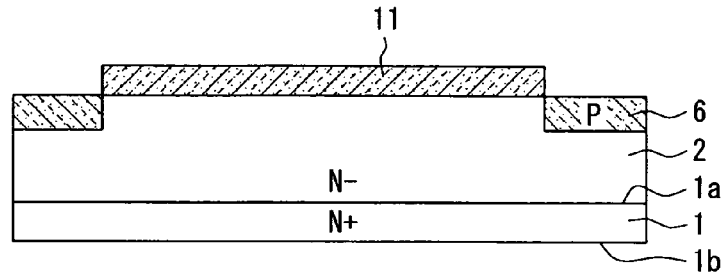

At a process shown in FIG. 3B, after positioning a mask 11 including an LTO (low-temperature oxide) or the like, openings are formed on the mask 11 by photolithography-etching. Locations of the openings correspond to areas where the P type resurf layer 6 and the P type guard ring layers 7 are to be formed. Then, with using the mask 11, the P type resurf layer 6 and the P type guard ring layers 7 are formed by implantation of P type impurities such as Al or the like and by heat treatment for impurity activation.

Figure 3C:
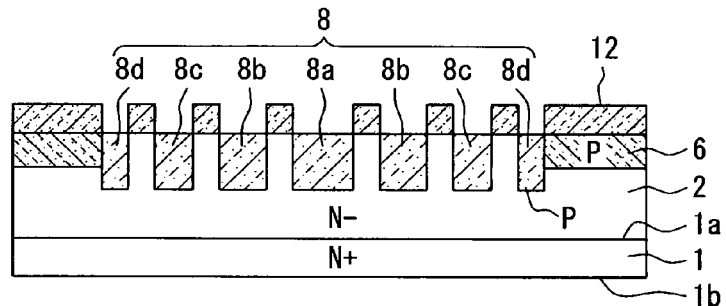

At a process shown in FIG. 3C, after removing the mask 11, a mask 12 including an LTO is positioned, and then, openings are formed on the mask 12 by photolithography-etching. Locations of the openings correspond to areas where the P type layers 8 are to be formed. With using the mask 12, the P type layers 8 are formed by implantation of P type impurities such as Al or the like and by heat treatment for impurity activation.

According to the above description, the process shown in FIG. 3B is performed separately from the process shown in FIG. 3C. Alternatively, the processes shown in FIGS. 3B and 3C may be combined in one process and preformed at a one time. More specifically, a mask may be prepared, and openings are formed on the mask. Here, locations of the openings correspond to areas where the P type resurf layer 6 and the P type guard ring layers are to be formed. Then, the P type resurf layer 6 and the P type guard ring layers may be formed at one time by implantation of P type impurities such as Al through the openings of the mask. Heat treatment for impurity activation may be performed.

Figure 3D:
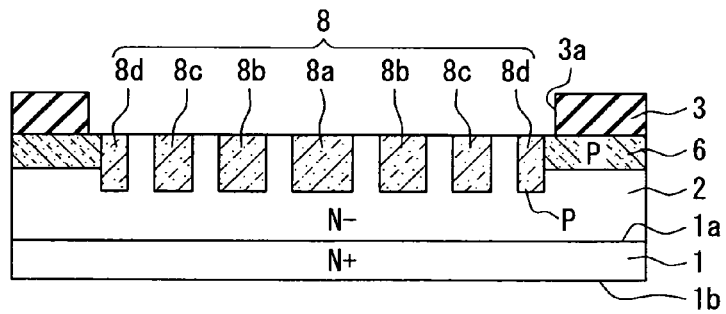

At a process shown in FIG. 3D, after removing the mask 12, a metal layer made of Ni, Ti, Mo, W, or the like is formed on the rear surface 1b of the N+ type substrate 1 to provide the ohmic electrode 5. Further, after cleaning an SiC surface by sacrifice oxidation for instance, a silicon oxide layer is formed by, for example, plasma CVD (chemical vapor deposition), and then, the insulating layer 3 is formed by reflow-processing the silicon oxide layer. The opening 3a is formed on the insulating layer 3 through photolithography-etching.

Figure 3E:
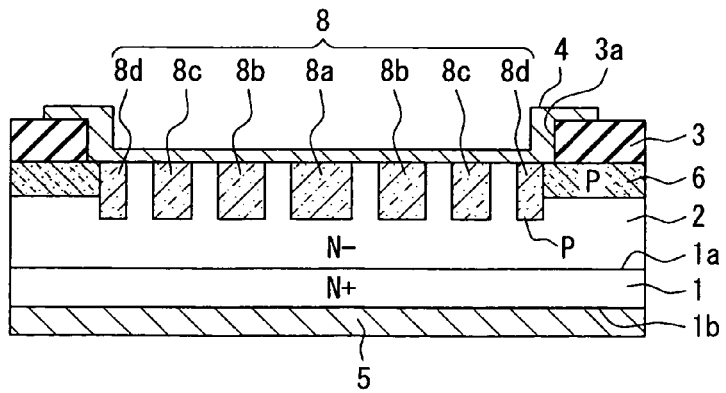

At a process shown in FIG. 3E, a metal layer made of Mo, Ti or Ni is formed on the insulating layer 3 and in the opening 3a. The Schottky electrode 4 is formed by patterning the metal layer.

Figure 2:
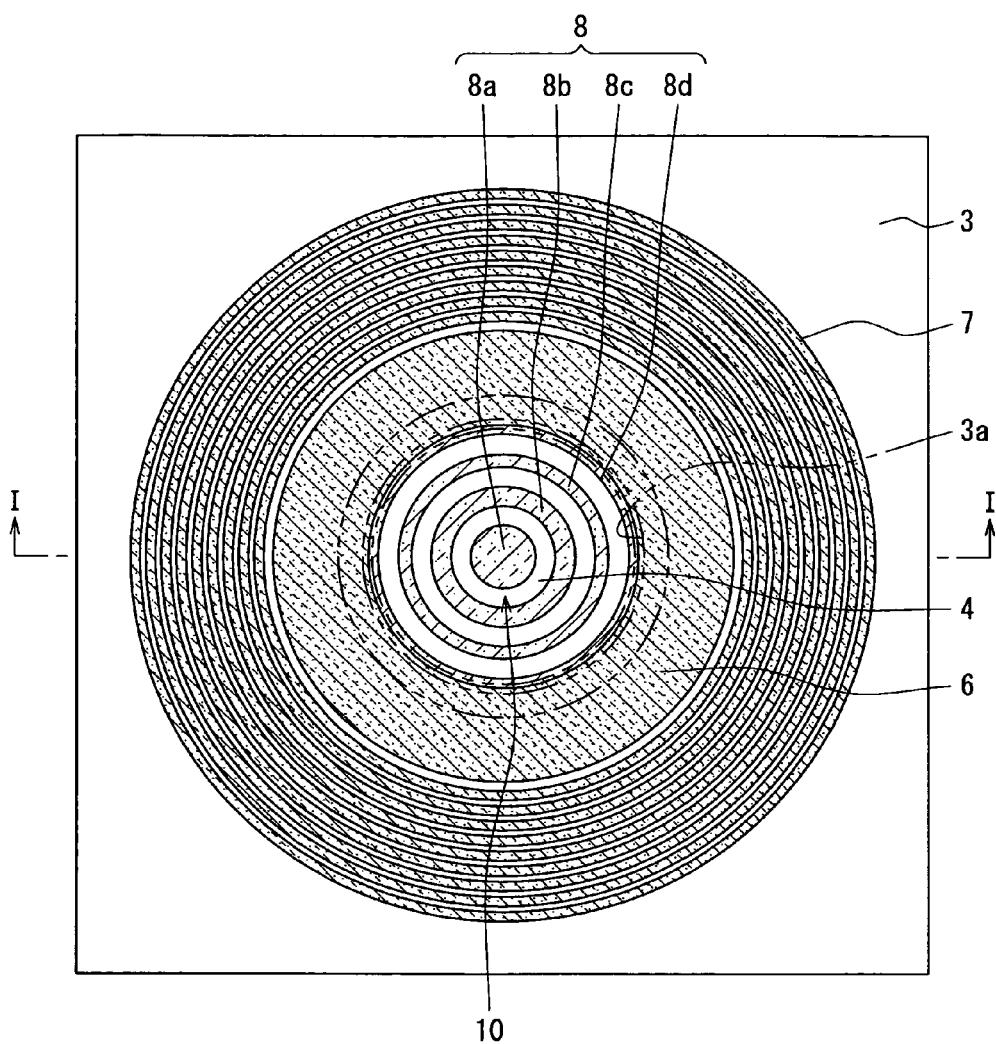
FIG. 2 is a layout diagram schematically illustrating elements arranged in a principal surface portion of an SiC semiconductor device in accordance with a first embodiment.

The SiC semiconductor device having the JBS 10 shown in, for example, FIG. 1 is provided through the above-described processes.

As described above, according to the present embodiment, the width of the one of the multiple P type layers is smaller than that of the another one of the multiple P type layers, the another one being disposed adjacent to the one of the multiple P type layers 8 and disposed closer to the center of the contact region than the one of the multiple P type layers 8. A portion of the P type layers 8 disposed around a central region have larger cross sections for a surge current flow, and therefore a resistance is decreased. Thus, a surge current may be easier to flow through a portion around the center member 8a than a portion around the outermost ring member 8d. An electric field is harder to concentrate at the area located around the boundary between the termination structure and the P type layers. It is possible to provide a higher surge breakdown voltage.

Second Embodiment

An SiC semiconductor device having a JBS according to a second embodiment is described below with reference to FIG. 4. Geometry of P type layers 8 according to the present embodiment is different from that of the P type layers 8 according to the first embodiment.

Figure 4:
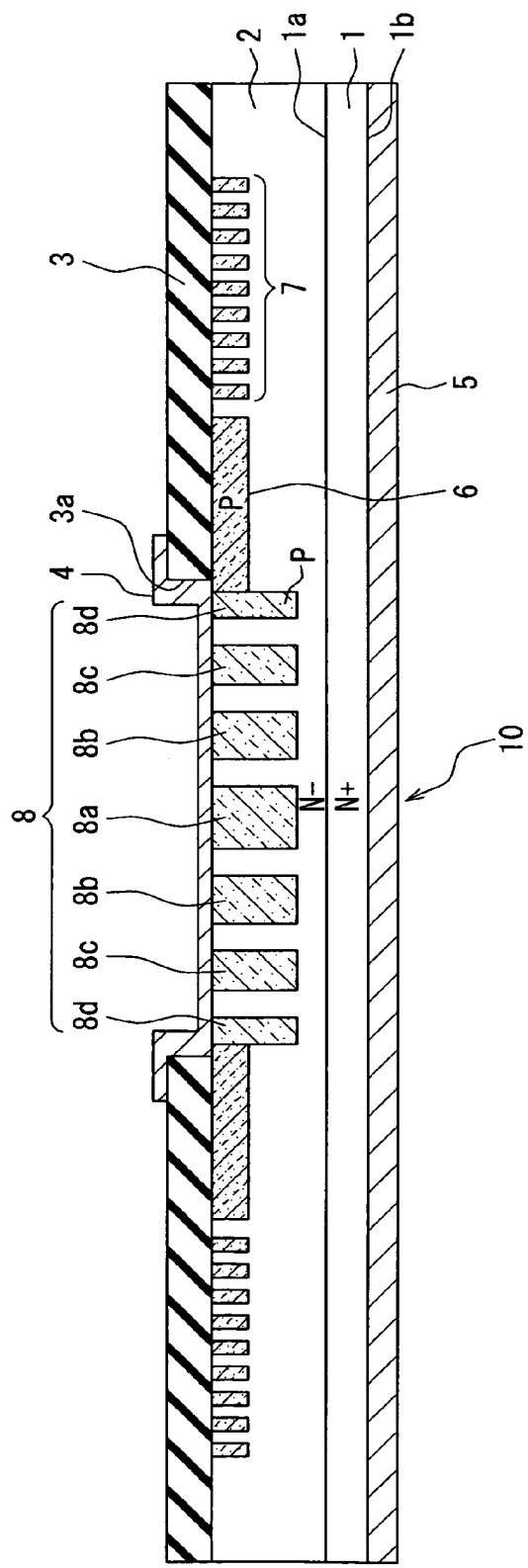
FIG. 4 is a diagram illustrating a cross sectional view of an SiC semiconductor device having a JBS in accordance with a second embodiment.

As shown in FIG. 4, a depth of each P type layer 8 is deeper than that of the P type resurf layer 6 and the P type guard ring layers 7 in a direction, for example, substantially perpendicular to the principal surface 1a of the substrate 1. The P type resurf layer 6 and the P type guard ring layers 7 are included in the termination structure. The depth of each P type layer 8 is, for example, in a range between 0.7 μm and 1.5 μm. A depth difference between each P type layer 8 and the P type resurf layer 6 is in a range between 0.2 μm and 1.0 μm. A depth difference between each P type layer 8 and each P guard ring layer 7 is also in the range between 0.2 μm and 1.0 μm.

Figure 5:
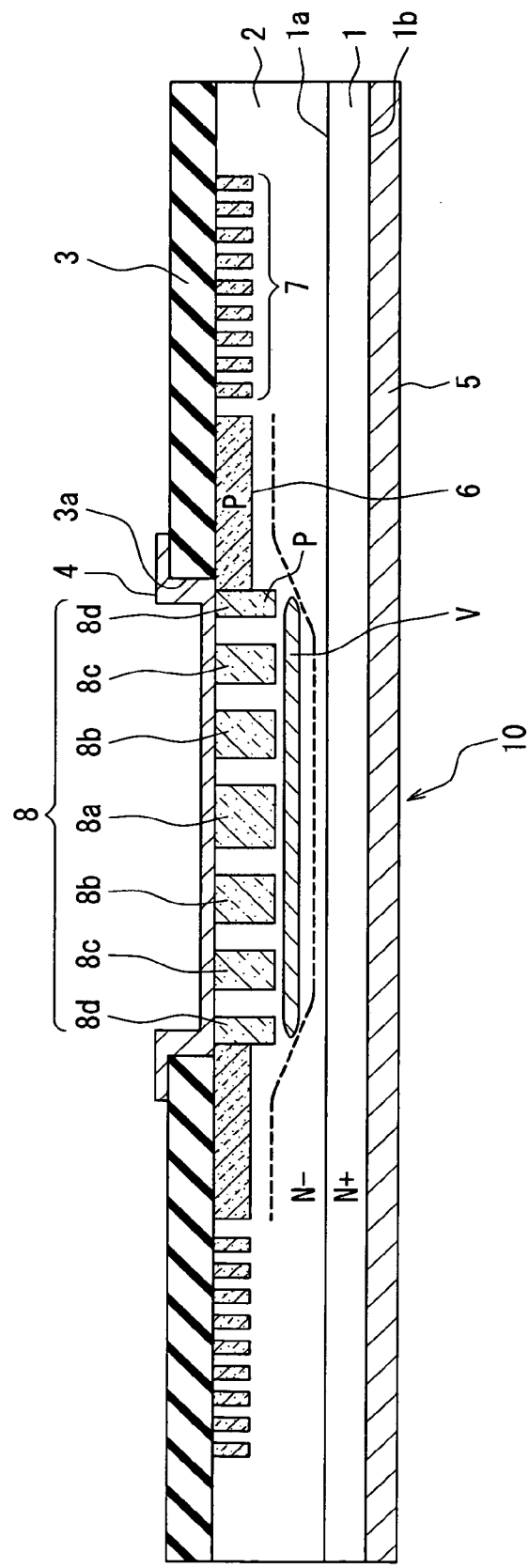
FIG. 5 is a diagram illustrating a cross sectional view of an SiC semiconductor device associated with FIG. 4, the diagram illustrating extension of a depletion layer in a case of surge.
Figure 8:
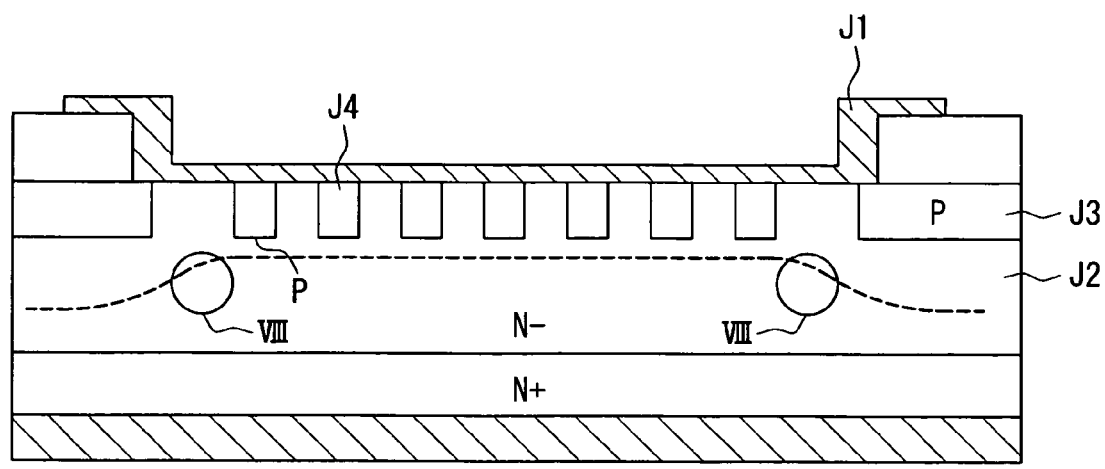
FIG. 8 is a diagram illustrating a cross sectional view of an SiC semiconductor device having a JBS in accordance with the prior art.

Since each P type layer 8 is deeper than the P type resurf layer 6 and the P type guard ring layers 7, a depletion layer developed in a case of surge may be one illustrated in FIG. 5 by a doted-line, wherein, in the surge, a voltage or a current exceeding a rated value may be applied. According to the present embodiment, a portion of the depletion layer created below the P type layers 8 is located in a deeper position of the N− type drift layer 2 than that according to the prior art shown in FIG. 8. The portion of the depletion layer created below the P type layers 8 according to the present embodiment is spaced apart from the Schottky electrode 4. Thus, an electric field is substantially diffused over a whole region located below the multiple P type layers 8, the region being illustrated in FIG. 5 with a symbol V. It is possible to uniformly flow a surge current through the PN diodes, which are provided by the P type layers and the N− type drift layer 2. Therefore, it is possible to provide a higher surge breakdown voltage.

Third Embodiment

An SiC semiconductor device having a JBS according to a third embodiment is described below with reference to FIG.

6. Depths of P type layers 8 according to the present embodiment are different from that of the P type layers 8 according to the first and second embodiments.

Figure 6:
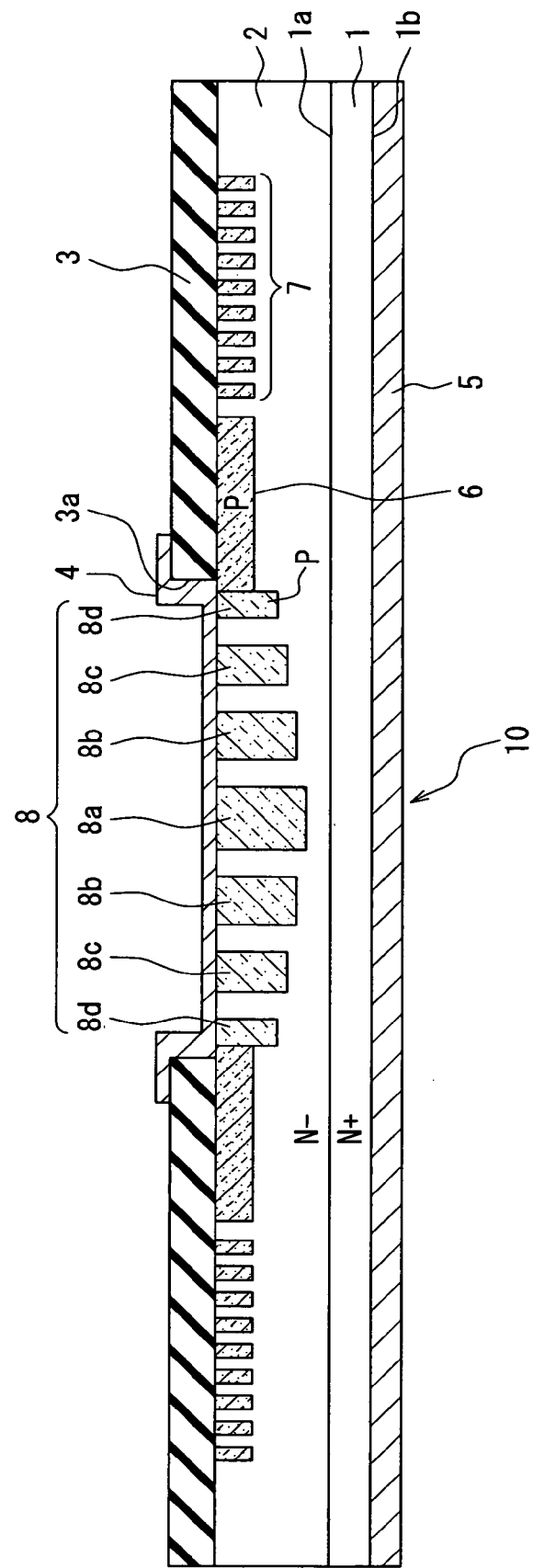
FIG. 6 is a diagram illustrating a cross sectional view of an SiC semiconductor device having a JBS in accordance with a third embodiment.

As shown in FIG. 6, a depth of one of the multiple P type layers is less than or equal to that of another one of the multiple P type layers, wherein the another one is disposed adjacent to the one of the multiple P type layers 8 and disposed closer to the center of the contact region than the one of the multiple P type layers 8. Some of the P type layers located around the center member 8a are configured to have a substantially equal depth. According to the above structure, when a depletion layer is created below a central portion of the contact region between the Schottky electrode 4 and the N– type drift layer 2, the depletion layer is located in a deep portion of the N– type drift layer 2. An electric field is thus harder to concentrate at the area located around the boundary between the termination structure and the P type layers 8. It is possible to provide a higher surge breakdown voltage.

A method for manufacturing the SiC semiconductor device according to the present embodiment is basically identical to that according to the first embodiment. According to the present embodiment, at the process shown in FIG. 3C, multiple masks 12 may be prepared for forming the P type layers 8 with different depths. Ion-implantation may be performed in sequence with using each mask 12 for forming one of or some of the P type layers 8 having a same depth.

Fourth Embodiment

An SiC semiconductor device having a JBS according to a fourth embodiment is described below with reference to FIG. 7. FIGS. 1, 4, 5 are diagrams also illustrating cross sectional views of an SiC semiconductor device taken along line I-I shown in FIG. 7. A layout configuration of a JBS according to the present embodiment is different from that of the JBS according to the first, second and third embodiments. A termination structure according to the present embodiment is also different from that according to the first, second and third embodiments.

Figure 7:
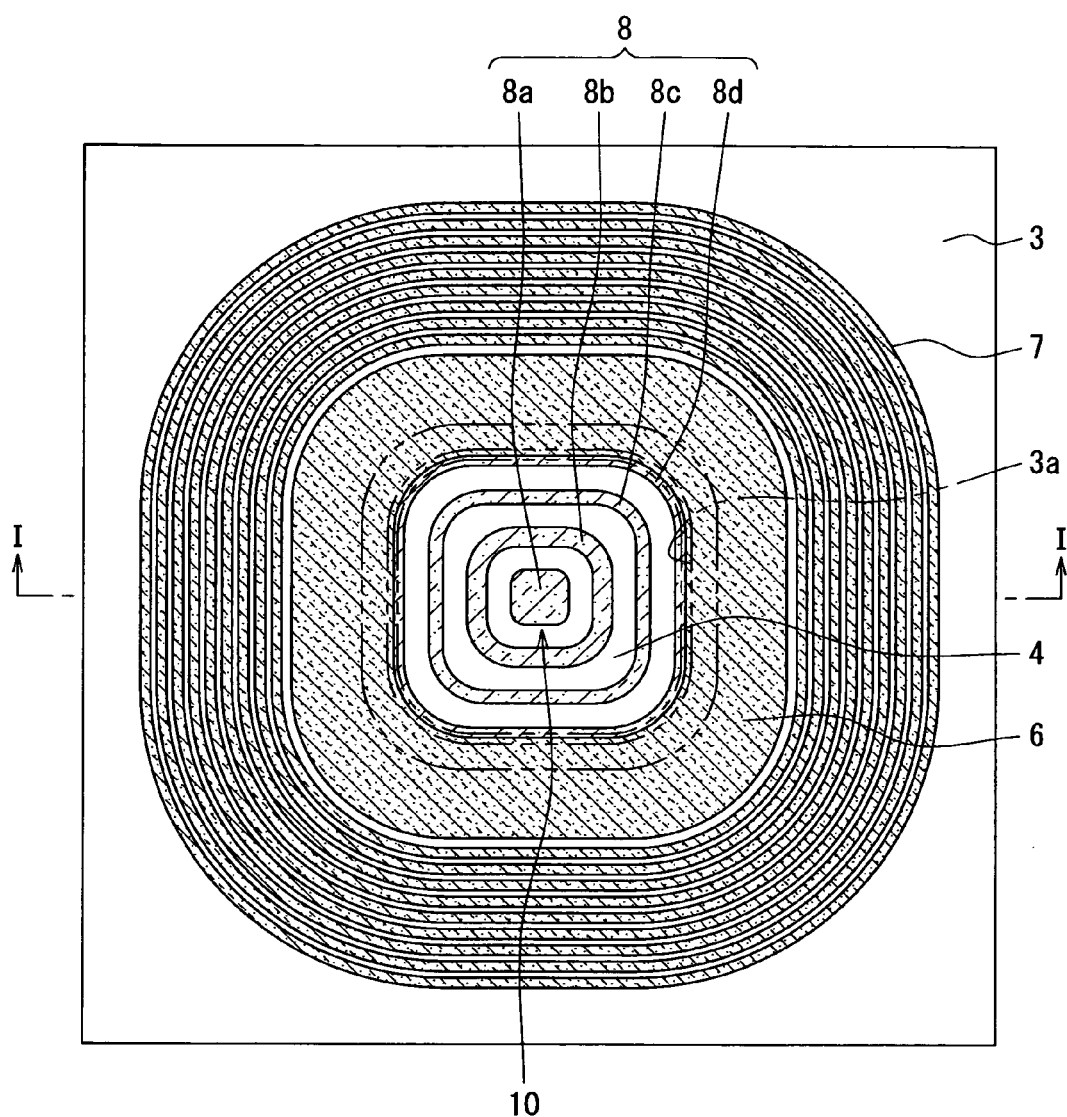
FIG. 7 is a layout diagram schematically illustrating elements arranged in a principal surface portion of an SiC semiconductor device having a JBS in accordance with a fourth embodiment.

As shown in FIG. 7, an inner periphery of the P type resurf layer 6 has a substantially square shape with rounded corners. In accordance with the shape of the inner periphery of the P type resurf layer 6, an inner periphery and an outer periphery of each P type layer 8a-8d also have a substantially square shape with rounded corners. In other words, a center member 8a surrounded by each ring member 8b-8d has an substantially square shape with rounded corners, and in addition, each ring member 8b-8d has an substantially square ring shape with rounded corners. According to the above structure, the SiC semiconductor device according to the present embodiment has advantages substantially identical to that according to the first and second embodiments.

Modified Embodiment

In the above embodiments, the number of the P type layers 8 corresponds to that shown in FIGS. 1-7. Alternatively, a different number of the P type layers 8 may be provided.

In the third embodiment, the inner periphery and outer periphery of each P type layer 6, 8 have the substantially square shape with rounded corners. Alternatively, the inner periphery and the outer periphery of each layer 6, 8 may have a substantially regular polygonal shape with rounded corners.

In the above embodiments, each P type layer 8 is configured to have the substantially circular or square shape to provide high symmetry. Alternatively, the P type layers may be configured to have the following structure. Multiple P type layers may include a plurality of circular or hexagonal P type layers separated from each other. Each circular or hexagonal P type layer may be disposed so that an arrangement of the plurality of circular or hexagonal P type layers is substantially symmetric with respect to the center of the contact region between the Schottky electrode 4 and the N– type drift layer 2. In addition, a width of one of the plurality of circular of hexagonal P type layers in a radial direction may be smaller than that of the another one of the plurality of circular of hexagonal P type layers, wherein the another one is disposed closer to the center of the contact region than the one of the multiple P type layers 8. Furthermore, the center member 8a, which is disposed on the center of the contact region, may have the largest width.

Figure 9:
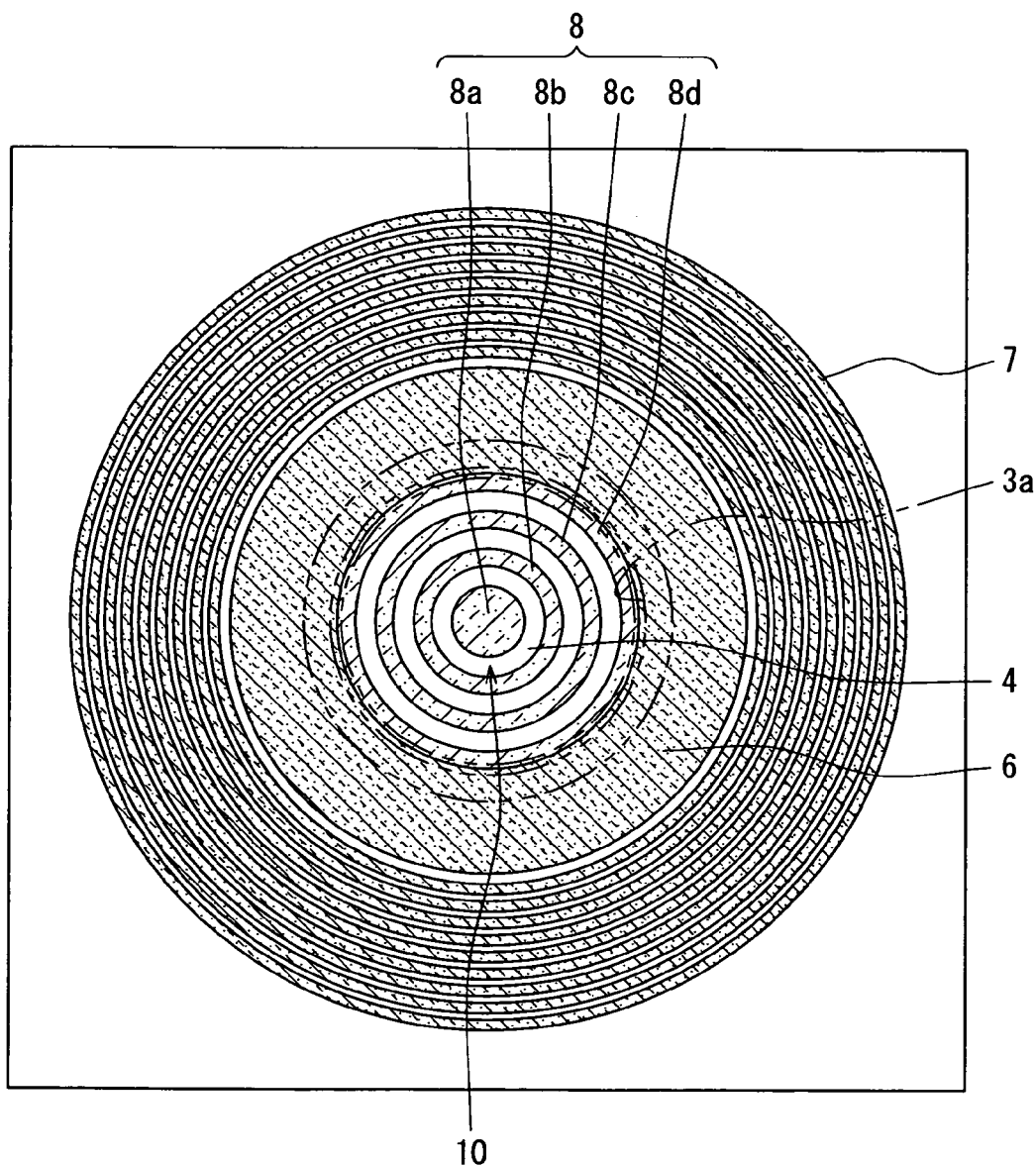
FIG. 9 is a layout diagram schematically illustrating elements arranged in a principal surface portion of an SiC semiconductor device having a JBS in accordance with a modified embodiment.
Figure 10:
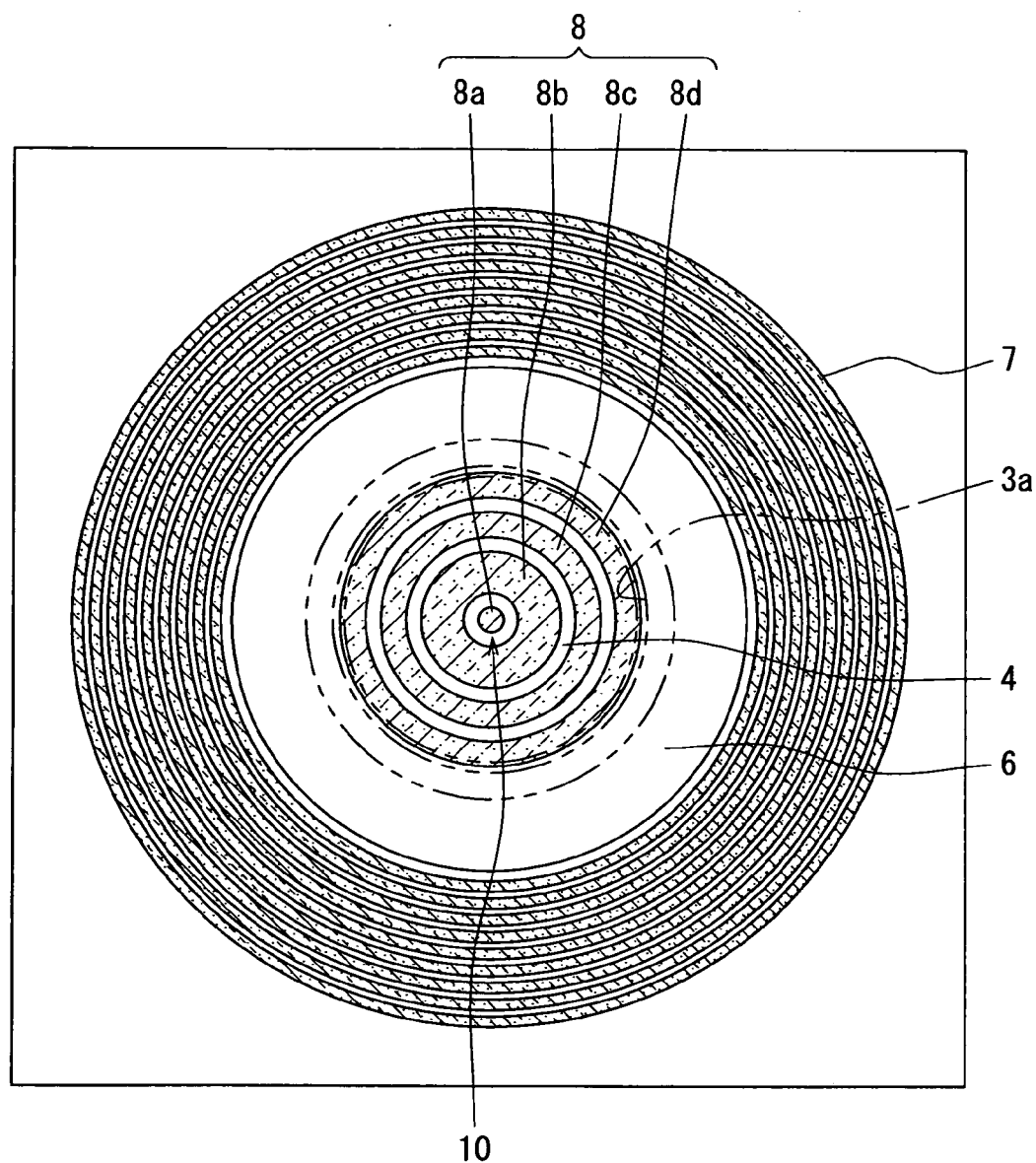
FIG. 10 is a layout diagram schematically illustrating elements arranged in a principal surface portion of an SiC semiconductor device having a JBS in accordance with another modified embodiment.

In the above embodiments, a width of each P type layer 8a-8d is gradually larger as the P type layer is located closer to the center of the contact region between the Schottky electrode 4 and the N– type drift layer 2. Alternatively, it may be sufficient that the width of the center member 8a be larger than that of the outermost ring member 8d. For example, as shown in FIG. 9, the P type layers 8 may be configured such that: the ring members 8b-8d have a same width; and a width of the center member 8a is larger than that of each ring member 8b-8d. Alternatively, as shown in FIG. 10, the P type layers may be configured such that: the ring members 8b-8d includes a middle ring member; the ring members 8c, 8d except a middle ring member 8b have a same width; the middle ring member 8b is disposed between the center member 8a and the outermost ring member 8d and may disposed adjacent to the center member 8a; and a width of the middle ring member 8b is larger than that of the center member 8a and the ring members 8b-8d.

When a first conductivity type and a second conductivity type are defined, the first and second conductivity types, respectively, correspond to the N and P conductivity types in the above described embodiments. Alternatively, a conductivity type of each element may be changed into an opposite conductivity type. For example, the layer 2 and each layer 8 may have the P and N conductivity types, respectively.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide semiconductor device comprising:
a substrate made of silicon carbide, having a first conductivity type, and having a principal surface and a rear surface opposite to each other;
a drift layer made of silicon carbide, having a first conductivity type, and disposed on the principal surface of the substrate, wherein an impurity concentration of the drift layer is lower than that of the substrate;
an insulating layer disposed on the drift layer and including an opening, wherein a part of the substrate and a part of the drift layer define a cell, which is positioned between the opening of the insulating layer and the rear surface of the substrate;
a Schottky electrode contacting the drift layer through the opening of the insulating layer to provide a Schottky contact;
an ohmic electrode disposed on the rear surface of the substrate;

a Schottky barrier diode provided by the ohmic electrode and the Schottky electrode;

a resurf layer disposed in a surface portion of the drift layer, having a second conductivity type, and surrounding the cell, wherein the resurf layer provides a termination structure;

a plurality of second conductivity type layers disposed in another surface portion of the drift layer, contacting the Schottky electrode, surrounded by the resurf layer, and separated from one another, wherein:

the drift layer and the plurality of second conductivity type layers provide a plurality of PN diodes;

each second conductivity type layer has a radial width with respect to a center of a contact region between the Schottky electrode and the drift layer;

the radial width of one of the plurality of second conductivity type layers is smaller than that of another one of the plurality of second conductivity type layers, the another one being disposed closer to the center of the contact region than the one of the plurality of second conductivity type layers;

the plurality of second conductivity type layers includes a center member, which is disposed at the center of the contact region between the Schottky electrode and the drift layer;

the plurality of second conductivity type layers further includes a plurality of ring members, each of which surrounds the center member;

one of the plurality ring members is defined as a innermost ring member, which is disposed adjacent to the center member; and a width of the innermost ring member is larger than that of the center member and that of the plurality of ring member except the innermost ring member.

2. The silicon carbide semiconductor device according to claim 1, wherein:

a depth of each second conductivity type layer is larger than that of the resurf layer.

3. The silicon carbide semiconductor device according to claim 1, wherein:

one of any two of the plurality of second conductivity type layers is defined as a close second conductivity type layer, which is disposed closer to the center of the contact region than the other of the any two of the plurality of second conductivity type layers;

the other of the any two of the plurality of second conductivity type layers is defined as a far second conductivity type layer; and the plurality of second conductivity type layers is configured such that a depth of the close second conductivity type layer is larger than that of the far second conductivity type layer.

4. The silicon carbide semiconductor device according to claim 1, wherein:

at least two of the plurality of second conductivity type layers have a substantially same depth; and the at least two of the plurality of second conductivity type layers are disposed around the center of the contact region between the Schottky electrode and the drift layer.

5. The silicon carbide semiconductor device according to claim 1, wherein:

each ring member is arranged substantially in a point symmetric manner on the contact region with respect to a center of the center member;

a two-dimensional plane passing through the center of the center member and perpendicular to the principal surface of the substrate is defined as a first plane;

the plurality of second conductivity type layers has a plurality of cross sections taken along the first plane;

the plurality of cross sections is defined as a plurality of first cross sections; and the plurality of second conductivity type layers is configured so that an arrangement of the plurality of first cross sections on the first plane is substantially symmetric with respect to a symmetry axis, which passes through the center of the center member and is perpendicular to the principal surface of the substrate.

6. The silicon carbide semiconductor device according to claim 5, wherein:

the plurality of ring members are arranged substantially in a concentric manner with respect to the center of the center member.

7. The silicon carbide semiconductor device according to claim 5, wherein:

the center member has a substantially regular polygonal shape with a plurality of rounded corners; and each ring member has a substantially regular polygonal ring shape with a plurality of rounded corners.

8. The silicon carbide semiconductor device according to claim 5, wherein:

one of the plurality of ring members is defined as an outermost ring member, which is disposed most distant from the center member; and the outermost ring member is in contact with an inner periphery of the resurf layer or embedded in the resurf layer.

9. The silicon carbide semiconductor device according to claim 5, wherein:

the plurality of second conductivity type layers is substantially arranged at regular intervals.

10. The silicon carbide semiconductor device according to claim 1, wherein the Schottky electrode is made of molybdenum, titanium or nickel.

11. The silicon carbide semiconductor device according to claim 1, wherein the ohmic electrode is made of molybdenum, titanium, nickel, or tungsten.

* * * * *